United States Patent
Sakaino

(10) Patent No.: US 9,564,737 B2
(45) Date of Patent: Feb. 7, 2017

(54) OPTICAL SEMICONDUCTOR DEVICE

(71) Applicant: Mitsubishi Electric Corporation, Tokyo (JP)

(72) Inventor: Go Sakaino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/887,558

(22) Filed: Oct. 20, 2015

(65) Prior Publication Data

US 2016/0211650 A1 Jul. 21, 2016

(30) Foreign Application Priority Data

Jan. 20, 2015 (JP) .................. 2015-008745

(51) Int. Cl.
| | |
|---|---|
| H01S 5/227 | (2006.01) |
| H01S 5/026 | (2006.01) |
| H01S 5/12 | (2006.01) |
| H01S 5/22 | (2006.01) |
| H01S 5/30 | (2006.01) |
| H01S 5/32 | (2006.01) |
| H01S 5/343 | (2006.01) |

(52) U.S. Cl.
CPC ............ *H01S 5/2275* (2013.01); *H01S 5/026* (2013.01); *H01S 5/12* (2013.01); *H01S 5/2222* (2013.01); *H01S 5/2224* (2013.01); *H01S 5/3054* (2013.01); *H01S 5/3211* (2013.01); *H01S 5/34306* (2013.01); *H01S 5/34366* (2013.01); *H01S 2301/17* (2013.01)

(58) Field of Classification Search
CPC ......... H01S 5/227; H01S 5/323; H01S 5/0421
See application file for complete search history.

(56) References Cited

U.S. PATENT DOCUMENTS

| | | | |
|---|---|---|---|
| 8,233,515 B2 | 7/2012 | Takiguchi | |
| 2005/0058169 A1* | 3/2005 | Onishi | B82Y 20/00 372/44.01 |
| 2005/0163178 A1* | 7/2005 | Takagi | B82Y 20/00 372/44.01 |

FOREIGN PATENT DOCUMENTS

| | | |
|---|---|---|
| JP | 2010-109215 A | 5/2010 |
| JP | 2011-014712 A | 1/2011 |
| JP | 2011-077329 A | 4/2011 |
| JP | 5463760 A | 1/2014 |

* cited by examiner

*Primary Examiner* — Dung Nguyen
(74) *Attorney, Agent, or Firm* — Studebaker & Brackett PC

(57) ABSTRACT

An upper cladding layer includes a first low carrier concentration layer having a lower carrier concentration than the p-type cladding layer and a first Fe-doped semiconductor layer formed on the first low carrier concentration layer. The leakage current suppression layer includes a second Fe-doped semiconductor layer disposed on a side of the p-type semiconductor layer. The first low carrier concentration layer has a side wall part that is in contact with a side face of the p-type cladding layer. The first Fe-doped semiconductor layer is disposed on a side of the p-type cladding layer via the side wall part of the first low carrier concentration layer and is not in contact with the p-type cladding layer.

4 Claims, 5 Drawing Sheets

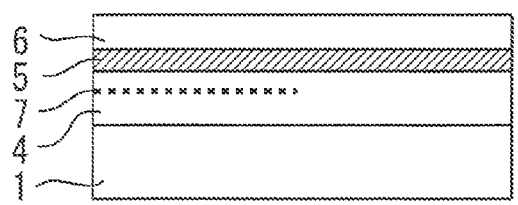
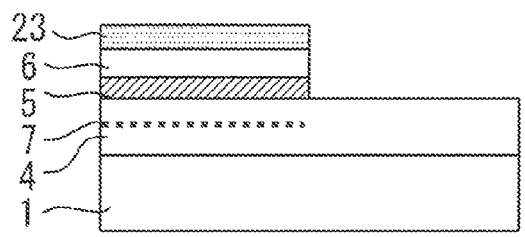
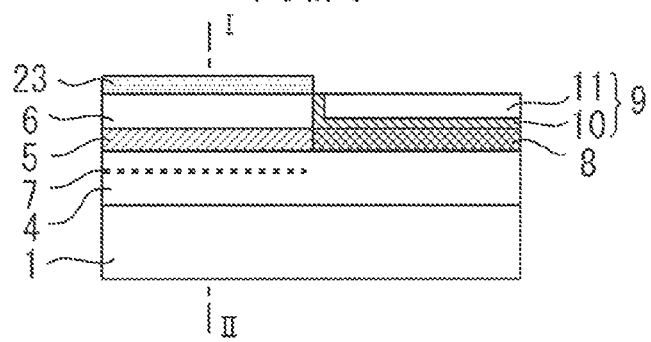
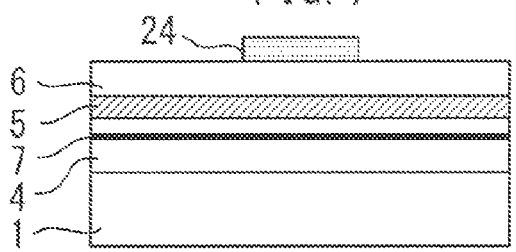
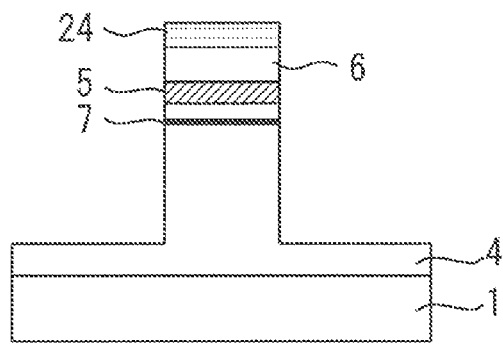

US 9,564,737 B2

OPTICAL SEMICONDUCTOR DEVICE

BACKGROUND OF THE INVENTION

Field of the Invention

The present invention relates to an optical semiconductor device which integrates a semiconductor laser section and an optical waveguide section, and more particularly, to an optical semiconductor device capable of making electrical separation between a semiconductor laser section and an optical waveguide section compatible with high optical coupling efficiency.

Background Art

With a semiconductor laser, optical waveguide, optical modulator or the like integrated therein, optical semiconductor devices are becoming increasingly smaller in size and more sophisticated in performance. An integrated optical semiconductor device is known which integrates an optical active element typified by a semiconductor laser and an optical waveguide on a substrate. In such an integrated optical semiconductor device, a plurality of integrated components are generally electrically separated from each other. A p-type semiconductor layer provided on the semiconductor laser section and the optical waveguide section is not a high-resistance layer due to the necessity for supplying a current to the semiconductor laser section. Thus, an apparatus is proposed which electrically separates the semiconductor laser section from the optical waveguide section by providing a separation groove in the p-type semiconductor layer between the semiconductor laser section and the optical waveguide section (e.g., see Japanese Patent Publication No. 5463760).

SUMMARY OF THE INVENTION

Signal light from the semiconductor laser section needs to be coupled with the optical waveguide section with high coupling efficiency. However, when the separation groove that electrically separates the semiconductor laser section from the optical waveguide section is deepened, light may be reflected or scattered when light from the semiconductor laser section is coupled with the optical waveguide section, which results in a problem that high coupling efficiency cannot be achieved.

In view of the above-described problems, an object of the present invention is to provide an optical semiconductor device capable of making electrical separation between the semiconductor laser section and the optical waveguide section compatible with high optical coupling efficiency.

According to the present invention, an optical semiconductor device includes: an n-type semiconductor substrate; a semiconductor laser section formed on the n-type semiconductor substrate and including an active layer worked into a mesa stripe shape and a p-type cladding layer formed on the active layer; an optical waveguide section formed on an optical output side of the active layer on the n-type semiconductor substrate and including an optical waveguide layer worked into a mesa stripe shape and an upper cladding layer formed on the optical waveguide layer; a semiconductor current constriction layer embedding both sides of the active layer and the optical waveguide layer; a p-type semiconductor layer formed on the semiconductor laser section; and a leakage current suppression layer formed on the optical waveguide section, wherein the upper cladding layer includes a first low carrier concentration layer having a lower carrier concentration than the p-type cladding layer and a first Fe-doped semiconductor layer formed on the first low carrier concentration layer, the leakage current suppression layer includes a second Fe-doped semiconductor layer disposed on a side of the p-type semiconductor layer, the first low carrier concentration layer has a side wall part that is in contact with a side face of the p-type cladding layer, and the first Fe-doped semiconductor layer is disposed on a side of the p-type cladding layer via the side wall part of the first low carrier concentration layer and is not in contact with the p-type cladding layer.

In the present invention, since the second Fe-doped semiconductor layer is provided on the p-type semiconductor layer side on the semiconductor laser section, it is possible to suppress a leakage current from the p-type semiconductor layer on the semiconductor laser section to the optical waveguide section. Even when the second Fe-doped semiconductor layer is provided, no reflection or scattering of light occurs when light from the semiconductor laser section is coupled with the optical waveguide section. Therefore, it is possible to make electrical separation between the semiconductor laser section and the optical waveguide section compatible with high optical coupling efficiency.

Other and further objects, features and advantages of the invention will appear more fully from the following description.

BRIEF DESCRIPTION OF THE DRAWINGS

FIG. 4 to FIG. 13 are cross-sectional views illustrating manufacturing steps of the optical semiconductor device according to the first embodiment of the present invention.

DETAILED DESCRIPTION OF THE PREFERRED EMBODIMENTS

An optical semiconductor device according to the embodiments of the present invention will be described with reference to the drawings. The same components will be denoted by the same symbols, and the repeated description thereof may be omitted.

First Embodiment

Figure 1:
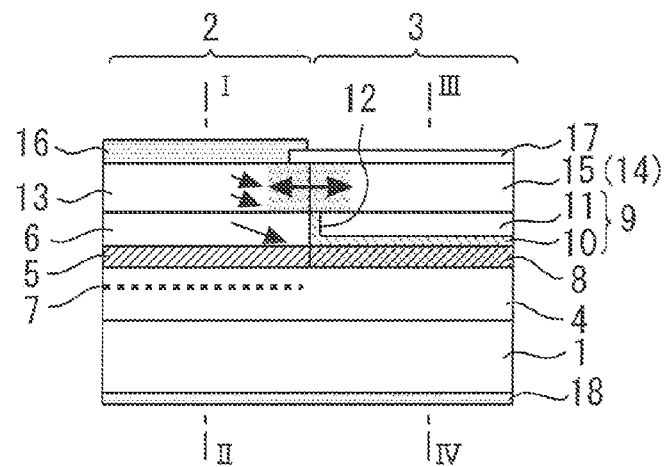
FIG. 1 is a cross-sectional view illustrating an optical semiconductor device according to a first embodiment of the present invention.

FIG. 1 is a cross-sectional view illustrating an optical semiconductor device according to a first embodiment of the present invention. FIG. 1 is a cross-sectional view of the optical semiconductor device cut in a resonator direction, that is, in a direction parallel to a traveling direction of laser light. This optical semiconductor device is an integrated optical semiconductor device in which a semiconductor laser section 2 and an optical waveguide section 3 are integrated on an n-type InP substrate 1.

The semiconductor laser section 2 includes an n-type InP cladding layer 4, an active layer 5 and a p-type InP cladding layer 6 formed in that order on the n-type InP substrate 1. A diffraction grating 7 is formed in the n-type InP cladding layer 4 and the semiconductor laser section 2 is a distribution feedback type semiconductor laser. A carrier concentration of the n-type InP cladding layer 4 is $1\times10^{18}$ cm$^{-3}$. The active layer 5 is an AlGaInAs distortion quantum well active layer having a thickness of 0.2 μm. A carrier concentration of the p-type InP cladding layer 6 is $1\times10^{18}$ cm$^{-3}$.

The optical waveguide section 3 is formed on an optical output side of the active layer 5. The optical waveguide section 3 includes the n-type InP cladding layer 4, an optical waveguide layer 8 and an upper cladding layer 9 formed in that order on the n-type InP substrate 1. The optical waveguide layer 8 is an InGaAsP optical waveguide layer having a thickness of 0.2 μm. An end face of the active layer 5 contacts an end face of the optical waveguide layer 8 and laser light from the active layer 5 passes through the optical waveguide layer 8 and travels toward the right side of the sheet.

The upper cladding layer 9 includes a low carrier concentration InP layer 10 and an Fe-doped InP layer 11 formed on the low carrier concentration InP layer 10. The low carrier concentration InP layer 10 has a lower carrier concentration than the p-type InP cladding layer 6 and has higher electric resistance. A carrier concentration of the Fe-doped InP layer 11 is $5\times10^{16}$ cm$^{-3}$. While the p-type InP cladding layer 6 has a thickness of 0.2 μm, both the low carrier concentration InP layer 10 and the Fe-doped InP layer 11 have a thickness of 0.1 μm.

The low carrier concentration InP layer 10 has a side wall part 12 that continuously covers a top surface of the optical waveguide layer 8 and a side face of the p-type InP cladding layer 6 and is in contact with a side face of the p-type InP cladding layer 6. The Fe-doped InP layer 11 continuously covers the top surface and the side face of the low carrier concentration InP layer 10, is disposed on a side of the p-type InP cladding layer 6 via the side wall part 12 of the low carrier concentration InP layer 10, and is not in contact with the p-type InP cladding layer 6.

A p-type InP layer 13 is formed on the semiconductor laser section 2. The p-type InP layer 13 has a carrier concentration of $1\times10^{18}$ cm$^{-3}$. A leakage current suppression layer 14 is formed on the optical waveguide section 3, that is, on the Fe-doped InP layer 11 and the side wall 12 of the low carrier concentration InP layer 10. The leakage current suppression layer 14 includes an Fe-doped InP layer 15 disposed on a side of the p-type InP layer 13. The Fe-doped InP layer 15 is in contact with a side face of the p-type InP layer 13. The Fe-doped InP layer 15 has a carrier concentration of $5\times10^{16}$ cm$^{-3}$.

A Ti/Pt/Au p-type electrode 16 is formed on the p-type InP layer 13. An SiO$_2$ insulating film 17 is formed on the Fe-doped InP layer 15. A Ti/Pt/Au n-type electrode 18 is formed on an underside of the n-type InP substrate 1.

Figure 2:
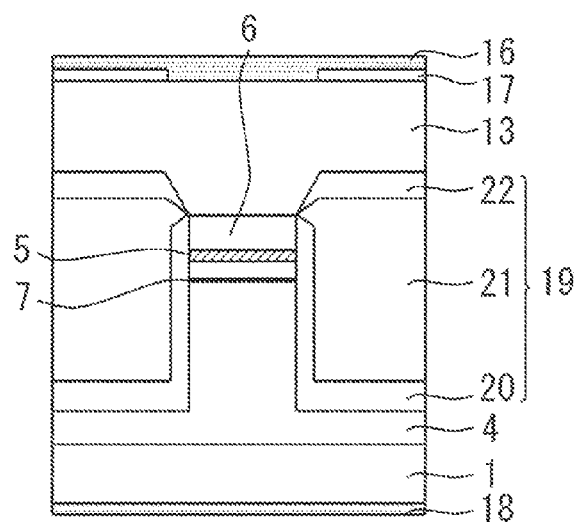
FIG. 2 is a cross-sectional view along I-II in FIG. 1.
Figure 3:
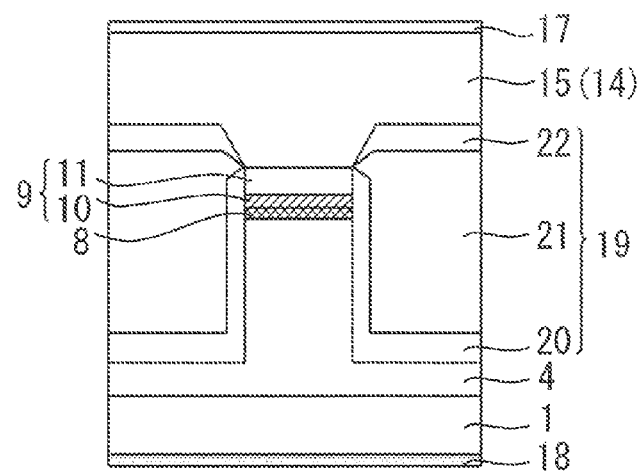
FIG. 3 is a cross-sectional view along III-IV in FIG. 1.

FIG. 2 is a cross-sectional view along I-II in FIG. 1. That is, FIG. 2 is a cross-sectional view of the semiconductor laser section 2 cut along a direction perpendicular to the resonator direction. FIG. 3 is a cross-sectional view along III-IV in FIG. 1. That is, FIG. 3 is cross-sectional view of the optical waveguide section 3 cut along a direction perpendicular to the resonator direction. The laminated structure of the semiconductor laser section 2 and the optical waveguide section 3 is worked into a mesa stripe shape. The semiconductor current constriction layer 19 embeds both sides of the active layer 5 and the optical waveguide layer 8. The current constriction layer 19 includes a p-type InP embedded layer 20, an Fe-doped InP embedded layer 21 and an n-type InP embedded layer 22 laminated on one another in that order.

The p-type InP embedded layer 20 has a carrier concentration of $1\times10^{18}$ cm$^{-3}$. The Fe-doped InP embedded layer 21 has a carrier concentration of $5\times10^{16}$ cm$^{-3}$. The n-type InP embedded layer 22 has a carrier concentration of $5\times10^{18}$ cm$^{-3}$.

FIG. 4 to FIG. 13 are cross-sectional views illustrating manufacturing steps of the optical semiconductor device according to the first embodiment of the present invention. FIG. 7 to FIG. 10 illustrate cross-sections cut along I-II in FIG. 6. That is, FIG. 7 to FIG. 10 are cross-sectional views of the semiconductor laser section 2 cut along a direction perpendicular to the resonator direction.

First, as shown in FIG. 4, the n-type InP cladding layer 4 is made to crystal-grow on the n-type InP substrate 1 using an MOCVD method. After forming the diffraction grating 7 using electron beam exposure, the n-type InP cladding layer 4 is additionally made to regrow. The active layer 5 of the AlGaInAs distortion quantum well and the p-type InP cladding layer 6 are made to crystal-grow on the n-type InP cladding layer 4.

Next, as shown in FIG. 5, an SiO$_2$ insulating film 23 is formed on the p-type InP cladding layer 6, and by applying patterning and dry etching thereto, portions of the active layer 5 and the p-type InP cladding layer 6 on the right side of the sheet are removed by etching.

Next, as shown in FIG. 6, the optical waveguide layer 8 of InGaAsP is made to crystal-grow in the portions removed by etching using the MOCVD method. Furthermore, the low carrier concentration InP layer 10 is made to crystal-grow on a top surface of the optical waveguide layer 8 and a side face of the p-type InP cladding layer 6 using the MOCVD method. The Fe-doped InP layer 11 is made to crystal-grow so as not to come into contact with the p-type InP cladding layer 6. After that, the SiO$_2$ insulating film 23 is removed by etching.

Figure 9:
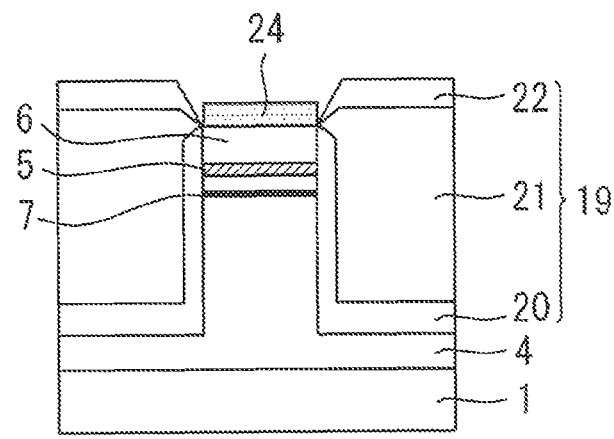

Next, as shown in FIG. 7, an SiO$_2$ insulating film 24 is formed and patterned. Next, as shown in FIG. 8, a ridge is formed through dry etching or the like. Next, as shown in FIG. 9, the p-type InP embedded layer 20, the Fe-doped InP embedded layer 21 and the n-type InP embedded layer 22 are made to crystal-grow using the MOCVD method. After that, the SiO$_2$ insulating film 24 is removed by etching.

Figure 10:
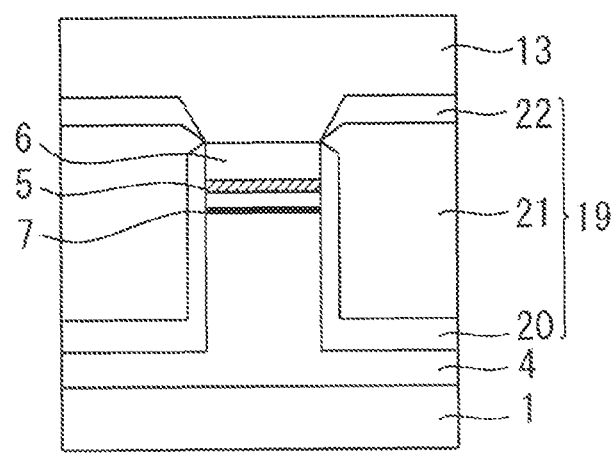
Figure 11:
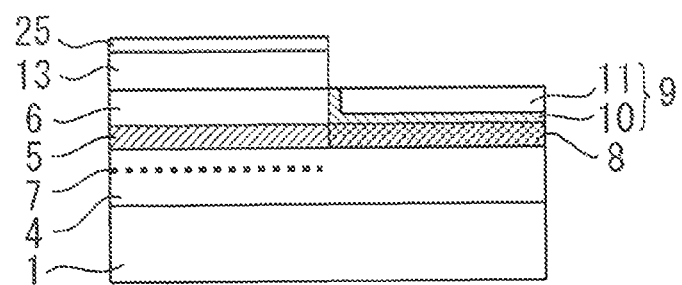

Next, as shown in FIG. 10, the p-type InP layer 13 of the semiconductor laser section 2 is made to crystal-grow using the MOCVD method. Next, as shown in FIG. 11, an SiO$_2$ insulating film 25 is formed, and by applying patterning and dry-etching thereto, the portion of the p-type InP layer 13 on the right side of the sheet is removed by etching.

Figure 12:
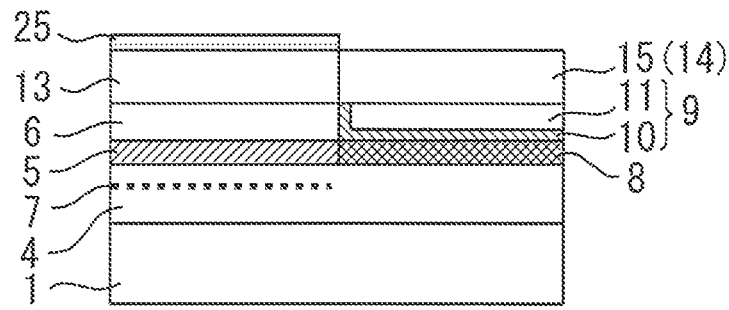
Figure 13:
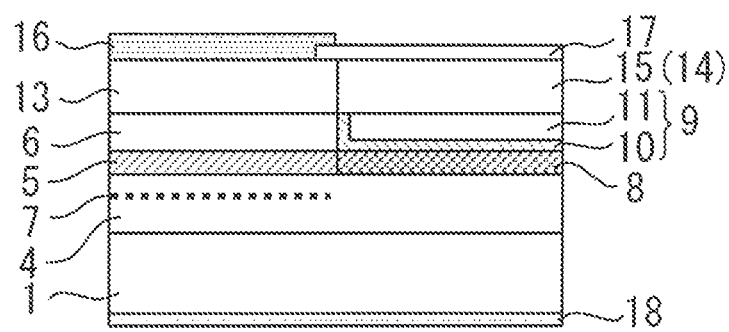

Next, as shown in FIG. 12, the Fe-doped InP layer 15 is made to crystal-grow in the portion removed by etching using the MOCVD method. Then, the SiO$_2$ insulating film 25 is removed by etching. Next, as shown in FIG. 13, the SiO$_2$ insulating film 17, the p-type electrode 16 and the n-type electrode 18 are formed. The optical semiconductor device according to the present embodiment is manufactured through the above-described steps.

Next, operation of the optical semiconductor device according to the present embodiment will be described. When a current is injected into the semiconductor laser section 2, the current flows through the active layer 5 via the p-type InP layer 13 and the p-type InP cladding layer 6, and laser light is emitted in the active layer 5. The laser light passes through the optical waveguide layer 8 and travels in the right direction in FIG. 1 and is then outputted.

Figure 14:
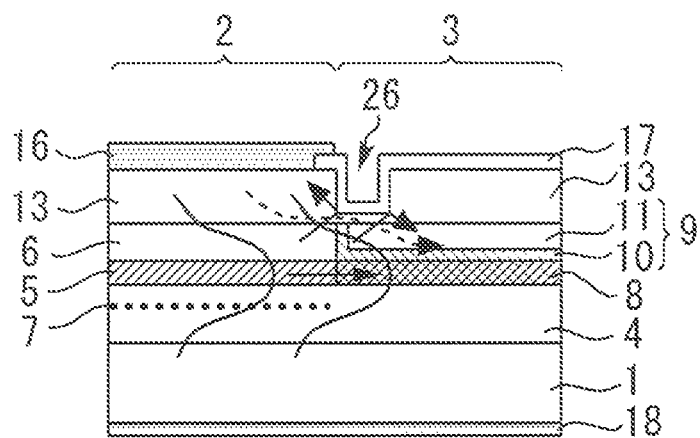
FIG. 14 is a cross-sectional view illustrating an optical semiconductor device according to a comparative example.

Next, effects of the present embodiment will be described in comparison with those in a comparative example. FIG. 14 is a cross-sectional view illustrating an optical semiconductor device according to a comparative example. In the comparative example, instead of the Fe-doped InP layer 15, the p-type InP layer 13 is formed on the optical waveguide section 3 as in the case of the semiconductor laser section 2. By providing a separation groove 26 in the p-type InP layer 13 between the semiconductor laser section 2 and the optical waveguide section 3, the semiconductor laser section 2 is electrically separated from the optical waveguide section 3. The rest of the configuration is similar to that of the present embodiment.

When the embedded layer as shown in FIG. 2 is used, the thickness of the p-type InP cladding layer 6 needs to be set to on the order of 50 to 200 nm to obtain high current injection efficiency in the semiconductor laser section 2. In order to fully electrically separate the semiconductor laser section 2 from the optical waveguide section 3, it is necessary to bring a base part of the separation groove 26 closer to a point on the order of 1 μm from the top end of the p-type InP cladding layer 6. In this case, since the waveguide light from the semiconductor laser section 2 side spreads in the direction of the p-type InP cladding layer 6, the waveguide light interferes with the side face of the separation groove 26, and thereby causes reflection or scattering, making it impossible to sufficiently secure optical coupling efficiency with the optical waveguide section 3.

Furthermore, when the base part of the separation groove 26 is separated from the top end of the p-type InP cladding layer 6 to avoid reflection or scattering of light, electrical separation becomes insufficient and some currents flow toward the optical waveguide section 3 side as shown by dotted line arrows in FIG. 14. These currents become leakage current components without contributing to light emission of laser light and this current leakage causes current optical output characteristics to deteriorate.

In contrast, in the present embodiment, no separation groove is formed between the p-type InP layer 13 and the Fe-doped InP layer 15. Instead, since the Fe-doped InP layer 15 is provided as a high-resistance layer on the p-type InP layer 13 side on the semiconductor laser section 2, it is possible to suppress a leakage current from the p-type InP layer 13 on the semiconductor laser section 2 to the optical waveguide section 3. Moreover, the low carrier concentration InP layer 10 and the Fe-doped InP layer 11 also operate as high resistance layers. Even when the Fe-doped InP layer 15 is provided, no reflection or scattering of light occurs when light from the semiconductor laser section 2 is coupled with the optical waveguide section 3. Therefore, it is possible to make electrical separation between the semiconductor laser section 2 and the optical waveguide section 3 compatible with high optical coupling efficiency.

Furthermore, since the side wall part 12 of the low carrier concentration InP layer 10 exists between the p-type InP cladding layer 6 of the semiconductor laser section 2 and the Fe-doped InP layer 11 of the optical waveguide section 3, a high-resistance process associated with mutual diffusion of Fe and Zn does not advance. Therefore, it is possible to prevent blocking of current injection into the active layer 5 of the semiconductor laser section 2, and thereby prevent deterioration of current optical output characteristics of the semiconductor laser section 2.

The Fe-doped InP layer 15 is in contact with a side face of the p-type InP layer 13. Since Fe and Zn used as dopants in the semiconductor layer have extremely high mutual diffusion, mutual diffusion of Fe and Zn occurs between the Fe-doped InP layer 15 and the p-type InP layer 13. Therefore, a p-type carrier concentration of the p-type InP layer 13 decreases in a boundary between both layers and a high-resistance process advances. This causes the resistance between the p-type InP layer 13 and the Fe-doped InP layer 15 to further increase, and can thereby reduce a leakage current compared to a case where only the resistance of the Fe-doped InP layer 15 is increased.

Second Embodiment

Figure 15:
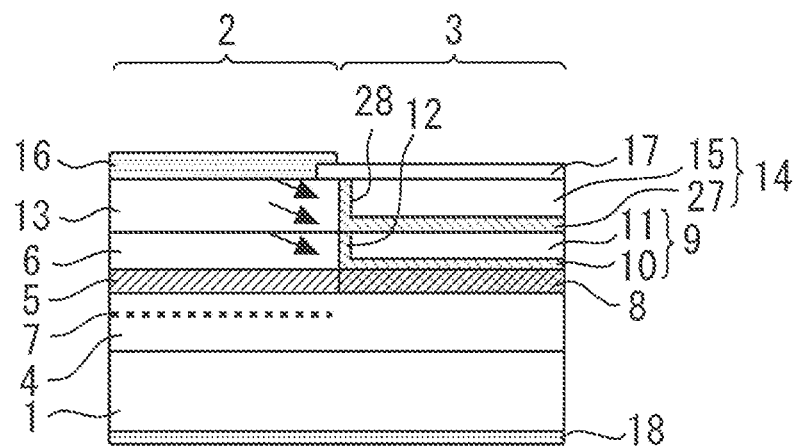
FIG. 15 is a cross-sectional view illustrating an optical semiconductor device according to a second embodiment of the present invention.

FIG. 15 is a cross-sectional view illustrating an optical semiconductor device according to a second embodiment of the present invention. In the present embodiment, the leakage current suppression layer 14 further includes a low carrier concentration InP layer 27 having a lower carrier concentration than that of the p-type InP layer 13. The low carrier concentration InP layer 27 includes a side wall part 28 which is in contact with a side face of the p-type InP layer 13. The Fe-doped InP layer 15 is disposed on a side of the p-type InP layer 13 via the side wall part 28 of the low carrier concentration InP layer 27 and is not in contact with the p-type InP layer 13. The rest of the configuration is similar to that of the first embodiment.

Since the side wall part 28 of the low carrier concentration InP layer 27 exists between the p-type InP layer 13 on the semiconductor laser section 2 and the Fe-doped InP layer 15 on the optical waveguide section 3, a high-resistance process associated with mutual diffusion of Fe and Zn does not advance. Therefore, it is possible to prevent a high-resistance process of the p-type InP layer 13 on the semiconductor laser section 2 which originally requires conductivity. This makes it possible to suppress a leakage current from the p-type InP layer 13 of the semiconductor laser section 2 to the optical waveguide section 3 while preventing blocking of current into the active layer 5 of the semiconductor laser section 2.

Third Embodiment

Figure 16:
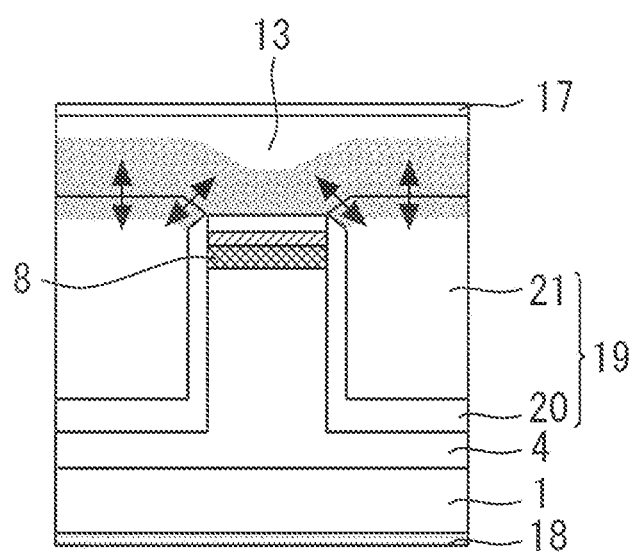
FIG. 16 is a cross-sectional view illustrating an optical semiconductor device according to a third embodiment of the present invention.

FIG. 16 is a cross-sectional view illustrating an optical semiconductor device according to a third embodiment of the present invention. FIG. 16 is a cross-sectional view of the optical waveguide section 3 cut along a direction perpendicular to the resonator direction. The p-type InP layer 13 is formed on the semiconductor laser section 2, the optical waveguide section 3 and the current constriction layer 19.

The current constriction layer 19 that embeds both sides of the semiconductor laser section 2 includes the p-type InP embedded layer 20, the Fe-doped InP embedded layer 21 and the n-type InP embedded layer 22 as in the case of FIG. 2 of the first embodiment. On the other hand, the current constriction layer 19 that embeds both sides of the optical waveguide layer 8 is the p-type InP embedded layer 20 and the Fe-doped InP embedded layer 21.

As the manufacturing method, after forming the embedded layer, n-type InP embedded layer 22 is removed from only the optical waveguide section 3 through patterning, dry etching or the like using an insulating film or the like as in the case of the first embodiment. After that, the insulating film is removed, and the p-type InP layer 13 is formed on the optical waveguide section 3 instead of the Fe-doped InP layer 15. Other steps are the same as those in the first embodiment.

In the present embodiment, the top layer of the current constriction layer 19 that embeds both sides of the optical waveguide layer 8 is the Fe-doped InP embedded layer 21, and this Fe-doped InP embedded layer 21 is in contact with the p-type InP layer 13. Mutual diffusion of Fe and Zn occurs between both layers and a lower part of the p-type InP layer 13 operates as a high-resistance layer. This makes it possible to reduce a leakage current from the p-type InP layer 13 of the semiconductor laser section 2 to the optical waveguide section 3. In this configuration, no reflection or scattering of light occurs when light from the semiconductor laser section 2 is coupled with the optical waveguide section 3. Therefore, it is possible to make electrical separation between the semiconductor laser section 2 and the optical waveguide section 3 compatible with high optical coupling efficiency.

Note that the optical semiconductor devices according to the first to third embodiments are optical waveguide integrated optical semiconductor devices in which the semiconductor laser section 2 and the optical waveguide section 3 are integrated. However, the present invention is not limited to this. Configurations similar to those of the first to third embodiments are also applicable to a configuration in which an optical active element such as an optical modulator or light amplifier and an optical waveguide are integrated adjacent to each other. The manufacturing method and materials used are not limited to those of the first to third embodiments, and the configuration and the manufacturing method are not necessarily limited to the above-described contents if similar effects can be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-008745, filed on Jan. 20, 2015 including specification, claims, drawings and summary, on which the Convention priority of the present application is based, is incorporated herein by reference in its entirety.

What is claimed is:

1. An optical semiconductor device comprising:
   an n-type semiconductor substrate;
   a semiconductor laser section formed on the n-type semiconductor substrate and including an active layer worked into a mesa stripe shape and a p-type cladding layer formed on the active layer;
   an optical waveguide section formed on an optical output side of the active layer on the n-type semiconductor substrate and including an optical waveguide layer worked into a mesa stripe shape and an upper cladding layer formed on the optical waveguide layer;
   a semiconductor current constriction layer embedding both sides of the active layer and the optical waveguide layer;
   a p-type semiconductor layer formed on the semiconductor laser section; and
   a leakage current suppression layer formed on the optical waveguide section,
   wherein the upper cladding layer includes a first low carrier concentration layer having a lower carrier concentration than the p-type cladding layer and a first Fe-doped semiconductor layer formed on the first low carrier concentration layer,
   the leakage current suppression layer includes a second Fe-doped semiconductor layer disposed on a side of the p-type semiconductor layer,
   the first low carrier concentration layer has a side wall part that is in contact with a side face of the p-type cladding layer, and
   the first Fe-doped semiconductor layer is disposed on a side of the p-type cladding layer via the side wall part of the first low carrier concentration layer and is not in contact with the p-type cladding layer.

2. The optical semiconductor device of claim 1, wherein the second Fe-doped semiconductor layer is in contact with a side face of the p-type semiconductor layer.

3. The optical semiconductor device of claim 1, wherein the leakage current suppression layer further includes a second low carrier concentration layer having a lower carrier concentration than the p-type semiconductor layer,
   the second low carrier concentration layer includes a side wall part which is in contact with a side face of the p-type semiconductor layer, and
   the second Fe-doped semiconductor layer is disposed on a side of the p-type semiconductor layer via the side wall part of the second low carrier concentration layer and is not in contact with the p-type semiconductor layer.

4. An optical semiconductor device comprising:
   an n-type semiconductor substrate;
   a semiconductor laser section formed on the n-type semiconductor substrate and including an active layer worked into a mesa stripe shape;
   an optical waveguide section formed on an optical output side of the active layer on the n-type semiconductor substrate and including an optical waveguide layer worked into a mesa stripe shape;
   a semiconductor current constriction layer embedding both sides of the active layer and the optical waveguide layer; and
   a p-type semiconductor layer formed on the semiconductor laser section, the optical waveguide section and the current constriction layer,
   wherein a top layer of the current constriction layer that embeds both sides of the optical waveguide layer is an Fe-doped semiconductor layer, and
   the Fe-doped semiconductor layer is in contact with the p-type semiconductor layer.

* * * * *